(12) United States Patent
Tsukahara

(10) Patent No.: US 6,232,211 B1
(45) Date of Patent: May 15, 2001

(54) TWO-STEP PROJECTING BUMP FOR SEMICONDUCTOR CHIP AND METHOD FOR FORMING THE SAME

(75) Inventor: Norihito Tsukahara, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/171,256

(22) PCT Filed: Apr. 16, 1997

(86) PCT No.: PCT/JP97/01311

§ 371 Date: Oct. 16, 1998

§ 102(e) Date: Oct. 16, 1998

(87) PCT Pub. No.: WO97/39480

PCT Pub. Date: Oct. 23, 1997

(30) Foreign Application Priority Data

Apr. 18, 1996 (JP) .................................................. 8-095774

(51) Int. Cl.[7] .................................................... H01L 21/44
(52) U.S. Cl. ........................ 438/612; 438/106; 438/613; 257/734; 257/737
(58) Field of Search .................................. 438/106, 612, 438/613; 257/734, 737

(56) References Cited

U.S. PATENT DOCUMENTS

| 4,442,967 | 4/1984 | van de Pas et al. . |
| 4,855,251 | * 8/1989 | Iyogz et al. . |
| 5,172,851 | 12/1992 | Matsushita et al. . |
| 5,226,582 | 7/1993 | Kubota et al. . |
| 5,246,159 | 9/1993 | Kitamura . |
| 5,299,729 | 4/1994 | Matsushita et al. . |
| 5,891,796 | * 4/1999 | Nakamura et al. . |
| 5,953,624 | * 9/1999 | Bando et al. . |
| 5,981,371 | * 11/1999 | Yamazaki et al. . |

FOREIGN PATENT DOCUMENTS

| 0 320 244 | 12/1988 | (EP) . |
| 0 409 582 | 7/1990 | (EP) . |
| 63304587 | 12/1988 | (JP) . |
| 3-50831 | 3/1991 | (JP) . |
| 4-146625 | 5/1992 | (JP) . |

OTHER PUBLICATIONS

"Development of 2 Stage Bump Forming Method Using Wire Bonding Technique", N. Tsukahara et al., Apr. 12, 1995, pp. 291–295.
Papers of Technical Meeting of IEEJ, vol. Etc.–94, No. 50–57, 1994, pp. 34 & 35 (refer to "2.1 Stud Bump").

* cited by examiner

Primary Examiner—Kevin M. Picardat
Assistant Examiner—D. M. Collins
(74) Attorney, Agent, or Firm—Wenderoth, Lind & Ponack, L.L.P.

(57) ABSTRACT

A two-staged projecting bump is formed on an electrode of a semiconductor element by a method of melting a leading end of a metallic wire passed through a capillary thereby forming a metallic ball. The metallic ball is bonded to the electrode of the semiconductor element, and the capillary is moved sideways and downward. The metallic wire is bonded onto the metallic ball bonded to the electrode of the metallic wire, and then pulled and broken. A metallic wire part immediately above the metallic ball where crystal grains are thermally influenced and turned coarse when the leading of the metallic wire is melted thereby forming the metallic ball is located inside a boundary where the bond between the metallic ball and the metallic wire terminates.

19 Claims, 15 Drawing Sheets

TWO-STEP PROJECTING BUMP FOR SEMICONDUCTOR CHIP AND METHOD FOR FORMING THE SAME

TECHNICAL FIELD

The present invention relates to a two-staged projecting bump of a semiconductor element and a method for forming the same by bonding a metallic ball formed at a leading end of a metallic wire to an electrode of the semiconductor element.

BACKGROUND ART

A conventional two-staged projecting bump and its formation method will be described with reference to FIGS. 12A–20.

FIGS. 12A–12F represent a conventional example of a method for forming a two-staged projecting bump.

In the conventional example, as shown in FIG. 12A, a metallic wire 1 of gold, copper, aluminum or solder is passed through a ceramic or ruby capillary 3. A discharging action is brought about between a leading end of the passed metallic wire 1 and an electrode 6, namely, torch, whereby a metallic ball 2 is formed at the leading end of the metallic wire 1.

In FIG. 12B, the metallic ball 2 is pressed onto a preheated electrode 4 of a semiconductor element 8, to which an ultrasonic vibration is impressed. The metallic ball 2 is bonded to the electrode 4 because of the temperature, pressure and the ultrasonic vibration. A reference numeral 5 is a passivation film for protecting an active face of the semiconductor element 8.

In FIG. 12C, the capillary 3 is raised in a vertical direction. Then, the capillary 3 is shifted sideways and descended as in FIG. 12D to bring the metallic wire 1 into contact with the metallic ball 2. The metallic wire 1 is bonded to the metallic ball 2 by temperature and pressure or, temperature, pressure and ultrasonic vibration. The capillary 3 is moved upward as shown in FIG. 12E, and the metallic wire 1 is pulled and broken as in FIG. 12F, whereby a two-staged projecting bump 7 is formed.

According to the above-described prior art, when the metallic ball 2 is formed by the metallic wire 1 through the discharging action, crystal grains of the metallic wire 1 at a part B immediately above the metallic ball 2 (which is denoted as a recrystallized area) are influenced by the heat and become coarse, as shown in FIG. 13. A breaking load of the part B is consequently reduced to nearly half in comparison with a part A not influenced by the heat.

In a case where the two-staged projecting bump 7 is formed through the processes of FIGS. 12A–12F, if a length of the part B which is decreased in breaking load to nearly half due to the influences of the heat as described above is elongated as shown in FIG. 14 with respect to a length of a part C where the metallic wire 1 and metallic ball 2 come in touch with each other, that is, a length C from immediately above the metallic ball 2 to a point D where the metallic wire 1 is to be pulled and broken, a breaking load of the point D where the metallic wire 1 is to be pulled and broken becomes approximately equal to the breaking load of the part B. Therefore, the exact part to be broken cannot be controlled, resulting in the generation of a defective two-staged projecting bump 7a including an excess portion of the metallic wire 1 as illustrated in FIG. 16, in contrast to the two-staged projecting bump 7 of FIG. 15 in a normal shape. The projections of bumps in two stages are thus irregularly shaped as shown in FIG. 17A.

When a conductive paste film 9 is transferred to the defective two-staged projecting bump 7a in a transfer method in the next step as shown in FIG. 17B, the amount of a conductive paste 10 transferred is too much as indicated in FIG. 17C.

In the event that the thus-constituted semiconductor element including the defective two-staged projecting bump 7a is bonded to electrodes 13 of a circuit board 12 in the above state, referring to FIG. 18, there is a likelihood that the excessive amount of conductive paste 10 will cause short-circuits at portions 11 among the electrodes 13.

The above defective two-staged projecting bump 7a which may cause the shortcircuit accident is also formed by the following reason.

In the process of bonding the metallic wire 1 with the metallic ball 2, depending on a diameter of the used metallic wire 1 or a size of the-metallic ball 2 formed, etc., the metallic wire 1 is caught by the capillary 3 and pressed at E as shown in FIG. 19, which leads to a narrow part (neck) 14 as shown in FIG. 20. The metallic wire 1 is eventually broken starting from the narrow part 14 when pulled and broken. In consequence, there is a likelihood that the defective two-staged projecting bump 7a with the excessive metallic wire 1 is generated as shown in FIG. 16, and too much conductive paste is transferred in the next process, thereby shortcircuiting the electrodes when the semiconductor element is mounted to the circuit board, as mentioned above.

Accordingly, the object of the present invention is to provide a good two-staged projecting bump of a semiconductor element without any variation in shape and a method for forming the bump.

SUMMARY OF THE INVENTION

In order to achieve the aforementioned objective, according to a first aspect of the present invention, there is provided a two-staged projecting bump which is formed on an electrode of a semiconductor element in a method of melting a leading end of a metallic wire passed through a capillary thereby forming a metallic ball. The metallic ball is bonded to the electrode of the semiconductor element and the capillary is moved sideways and down. The metallic wire is then bonded onto the metallic ball bonded to the electrode, and the metallic wire is pulled and broken.

A metallic wire part immediately above the metallic ball is thermally influenced to turn crystal grains coarse during the process of melting the leading end of the metallic wire thereby forming the metallic ball. The wire art is located inside a boundary where the bonding between the metallic ball and the metallic wire terminates.

In the arrangement of the first aspect, a crystal grain structure of the metallic wire on or above the position where the metallic wire is to be pulled and broken is made uniform, thereby making a breaking load at the part uniform. The metallic wire is accordingly broken starting from the position having a reduced sectional area due to the pressure of the capillary at which the metallic wire is to be pulled and broken. In other words, the metallic wire is always broken at the position to be pulled and broken, so that the two-staged projecting bump of a uniform shape can be obtained. Thus, the two-staged projecting bumps can be formed with no variations in shape.

According to a second aspect of the present invention, there is provided a method of forming a two-staged projecting bump on a semiconductor element, which includes melting a leading end of a metallic wire passed through a capillary thereby forming a metallic ball. The metallic ball is bonded to an electrode of a semiconductor element, and the capillary is moved sideways and down. The metallic wire is bonded onto the metallic ball bonded to the electrode, and the metallic wire is pulled and broken, thereby forming a two-staged projecting bump on the electrode.

A parameter of melting in the process where the leading end of the metallic wire passed through the capillary is melted thereby forming the metallic ball is controlled. As a result, a metallic wire area immediately above the metallic ball where crystal grains are thermally influenced by the melting and thus turned coarse is accommodated in length within a position where the metallic wire is to be pulled and broken.

According to a third aspect of the present invention, there is provided a method of forming a two-staged projecting bump on a semiconductor element defined in the second aspect, wherein the parameter of the melting process is a discharging time for impressing a voltage between the leading end of the metallic wire and a metallic ball formation electrode when the leading end of the metallic wire is melted thereby forming the metallic ball.

In general, in a case where the melting process is carried out by melting, the parameters when the metallic ball is formed at the leading end of the metallic wire through discharging are a discharging time, a discharging current, and a discharging voltage. Among the parameters, the factors that influence the length of the area of the metallic wire where the crystal grains are thermally influenced by the melting and thus turned coarse include, for instance, the discharging time. Therefore, in the third aspect, the discharging time is controlled and set so that the crystal grain structure of the metallic wire above the position to be pulled and broken becomes uniform. When the metallic ball is formed thereby forming the two-staged projecting bump in the above state, the metallic wire is broken from the to-be-pulled-and-broken position of a sectional area reduced because of pressing by the capillary. In other words, the metallic wire can always be broken at the position to be pulled and broken. The good two-staged projecting bumps can be obtained without being varied in shape.

According to a fourth aspect of the present invention, there is provided a method of forming a two-staged projecting bump on a semiconductor element, which includes melting a leading end of a metallic wire passed through a capillary thereby forming a metallic ball. The metallic ball is bonded to an electrode of a semiconductor element, and the capillary is moved sideways and down. The metallic wire is bonded onto the metallic ball bonded to the electrodes, and then pulled and broken to thereby form a two-staged projecting bump on the electrode.

A diameter of the metallic ball bonded on the electrode of the semiconductor element in the bonding process wherein the metallic ball is bonded onto the electrode of the semiconductor element is controlled so that a metallic wire area immediately above the metallic ball where crystal grains are thermally influenced by the melting and turned coarse is accommodated within a position where the metallic wire is to be pulled and broken.

According to a fifth aspect of the present invention, there is provided a method of forming a two-staged projecting bump on a semiconductor element, wherein pressure, pressing speed, bonding time, or bonding temperature when the metallic ball is bonded to the electrode of the semiconductor element is controlled to control the diameter of the metallic ball.

In general, a distance from immediately above the metallic ball to the position of the metallic wire where the metallic wire is to be pulled and broken (namely, to an edge part of the metallic ball bonded on the electrode of the semiconductor element) depends on a diameter of the metallic ball bonded on the electrode. The larger the diameter of the metallic ball is, the longer becomes the distance. The smaller the diameter of the metallic ball is, the shorter becomes the distance. Therefore, in the fourth and fifth aspects, the diameter of the metallic ball is always set so that the part of the metallic wire immediately above the metallic ball where the crystal grains become coarse due to thermal influences by the melting is within (that is, on or lower than) the position to be pulled and broken, and then a two-staged projecting bump is formed. The metallic wire is thus broken starting from the position of the metallic wire to be pulled and broken where the sectional area is reduced because of the pressing by the capillary. The wire can always be pulled and broken at the position where the metallic wire is to be pulled and broken, whereby the two-staged projecting bump can be formed in uniform shape.

According to a sixth aspect of the present invention, there is provided a method for forming a two-staged projecting bump on a semiconductor element, which includes melting a leading end of a metallic wire passed through a capillary thereby forming a metallic ball. The metallic ball is bonded to an electrode of a semiconductor element, and the capillary is moved sideways and down. The metallic wire is bonded onto the metallic ball bonded to the electrode, and then pulled and broken to thereby form a two-staged projecting bump on the electrode.

In the event that the metallic wire is caught between the semiconductor element and the capillary thereby bringing about a neck in the bonding process wherein the metallic wire is bonded onto the metallic ball bonded to the electrode, a hardness of a part of the metallic wire where the neck is brought about is set to be not smaller than $2/3$ of the hardness of the metallic wire not thermally influenced by the melting.

In the sixth aspect, in general, since a size of the neck brought about to the metallic wire when pressed by the capillary is dependent on the hardness of the metallic wire at the part, the softer the metallic wire is, the larger the neck becomes. On the other hand, the size of the neck influences the breaking load at the neck part of the metallic wire. The larger the neck is, the more the breaking load is decreased. Therefore, in the sixth aspect, the hardness of the part of the metallic wire where the neck is brought about is made not smaller than $2/3$ of the hardness of the metallic wire of a part not thermally influenced by the melting. Consequently, a breaking strength of the neck part which depends on the size of the neck brought about at the hardness is increased more than that of the part of the metallic part to be pulled and broken. The metallic wire is accordingly always broken at the position to be pulled and broken, thus realizing the two-staged projecting bump of a uniform shape.

According to a seventh aspect of the present invention, there is provided a method of forming a two-staged projecting bump on a semiconductor element, as defined in the sixth aspect, wherein a parameter in the melting process in which the leading end of the metallic wire is melted to thereby form the metallic ball is controlled to control a length of the area immediately above the metallic ball of the metallic wire where crystal grains are turned coarse. Therefore, the hardness of the part of the metallic wire where the neck is brought about by the pressing by the capillary is not smaller than $2/3$ of the hardness of the metallic wire not thermally influenced by the melting.

The hardness within the area length of the metallic wire immediately above the metallic ball where the crystal grains become coarse due to thermal influences by the melting is increased as the distance from immediately above the metallic ball is increased. This hardness eventually reaches the hardness of the part without being thermally influenced. The hardness of the metallic wire at the neck part brought about by the pressing of the capillary is changed by a change of the range of the area where the crystal grains are coarse. On the other hand, the range of the area where the crystal grains are coarse is controllable by the discharging time as a discharging parameter. In the seventh aspect, therefore, the length of the area where the crystal grains are coarse is controlled by the discharging time as a parameter in forming the metallic ball so that the hardness of the part of the metallic wire where the neck is brought about by the pressing by the capillary is not smaller than ⅔ of the hardness of the metallic wire of the part that is not thermally influenced by the melting. Thus, the metallic wire can be broken at all times at the position to be pulled and broken. Accordingly, the two-staged projecting bump of uniform shape can be obtained.

According to an eighth aspect of the present invention, there is provided a two-staged projecting bump which is formed on a semiconductor element in a method of melting a leading end of a metallic wire passed through a capillary thereby forming a metallic ball. The metallic ball is bonded to an electrode of a semiconductor element, and the capillary is moved sideways and down. The metallic wire is bonded onto the metallic ball bonded to the electrode, and then pulled and broken thereby forming a two-staged projecting bump on the electrode, wherein the metallic wire immediately above the metallic ball is formed in a loop.

In the eighth aspect, a distance to an edge part of the metallic ball bonded on the electrode of the semiconductor element can be made optionally long, thereby positioning the metallic wire area immediately above the metallic ball where the crystal grains are thermally influenced by the melting and thus turned coarse within the position of the metallic wire to be pulled and broken. The uniform two-staged projecting bump can hence be formed.

According to a ninth aspect of the present invention, there is provided a method of forming a two-staged projecting bump on a semiconductor element, which includes melting a leading end of a metallic wire passed through a capillary thereby forming a metallic ball. The metallic ball is bonded to an electrode of a semiconductor element, and the capillary is moved sideways and down. The metallic wire is bonded onto the metallic ball bonded to the electrode, and then pulled and broken thereby forming a two-staged projecting bump on the electrode.

When the metallic wire immediately above the metallic ball is shaped in a loop by moving the capillary after the metallic ball is bonded to the electrode of the semiconductor and the looped metallic wire is bonded onto the metallic ball bonded to the electrode, a size of the loop is adjusted. Therefore, a metallic wire area immediately above the metallic ball where crystal grains are thermally influenced by the melting and turned coarse is accommodated within a position where the metallic wire is to be pulled and broken.

Accordingly, in the ninth aspect, the two-staged projecting bumps can be formed in a uniform shape.

According to a tenth aspect of the present invention, in the method of forming a two-staged projecting bump on a semiconductor element defined in the ninth aspect, when the metallic wire immediately above the metallic ball is shaped into a loop by moving the capillary, the metallic wire is moved in a direction away from a direction of bonding to the metallic ball before being bonded to the metallic ball.

According to an eleventh aspect of the present invention, there is provided a method of forming a two-staged projecting bump on a semiconductor element, which includes melting a leading end of a metallic wire passed through a capillary thereby forming a metallic ball. The metallic ball is bonded to an electrode of a semiconductor element, and the capillary is moved sideways and down. The metallic wire is bonded onto the metallic ball bonded to the electrode, and then pulled and broken thereby forming a two-staged projecting bump on the electrode.

In the event the metallic wire is caught between the semiconductor element and the capillary thereby bringing about a neck in the bonding process where the metallic wire is bonded onto the metallic ball bonded to the electrode, the metallic wire immediately above the metallic ball is shaped in a loop by moving the capillary after the metallic ball is bonded to the electrode of the semiconductor element. Then the looped metallic wire is bonded onto the metallic ball connected to the electrode, with a size of the loop being adjusted, so that a hardness of a part of the metallic wire where the neck is brought about is set to be not smaller than ⅔ of the hardness of the metallic wire not thermally influenced by the melting.

According to a twelfth aspect of the present invention, there is provided a bump formed by the bump forming method of any of the second through seventh aspects.

According to a thirteenth aspect of the present invention, there is provided a bump formed according to the bump forming method of any of the ninth through eleventh aspects.

Accordingly, the two-staged projecting bumps of uniform shape can be provided in the tenth through thirteenth aspects.

BRIEF DESCRIPTION OF THE DRAWINGS

These and other objects and features of the present invention will become clear from the following description taken in conjunction with the preferred embodiments thereof with reference to the accompanying drawings, in which.

DETAILED DESCRIPTION OF THE INVENTION

Figure 1:
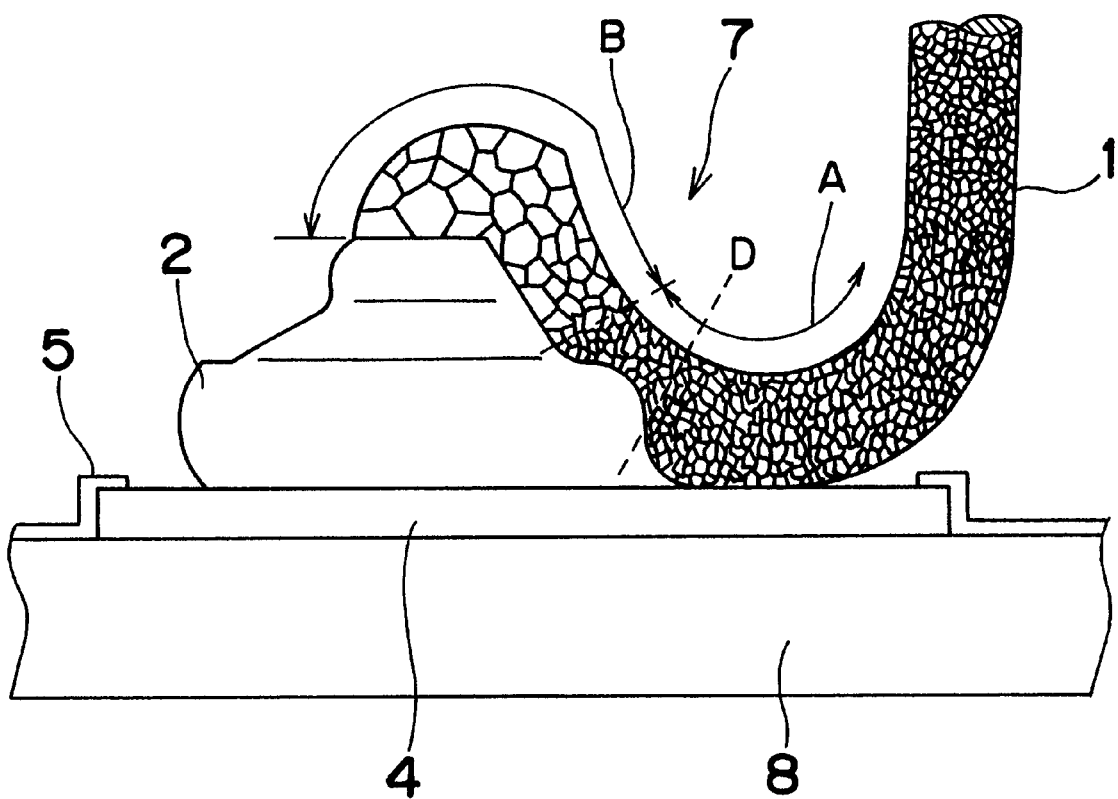
FIG. 1 is a state diagram of a crystal structure of a metallic wire immediately above a metallic ball of a two-staged projecting bump according to a first embodiment of the present invention.

Before the description of the present invention proceeds, it is to be noted that like parts are designated by the same reference numerals in the attached drawings.

Two-staged projecting bumps of semiconductor elements and methods for forming the same according to a plurality of embodiments of the present invention will be described hereinbelow with reference to FIGS. 1 through 11F.

FIRST EMBODIMENT

FIGS. 1 through 6 show a two-staged projecting bump and a method for forming the bump according to a first embodiment of the present invention.

FIG. 1 is a state diagram of a metallic wire 1 of the two-staged projecting bump 7 formed in the bump-forming method of the first embodiment of the present invention. Specifically, the figure shows a state immediately before the wire 1 is pulled and broken at a final process of the method. The bump is formed fundamentally in the same manner as represented in FIGS. 12A–12F. In particular, in sequential steps, a high voltage is applied between a leading end of the metallic wire 1 of gold, copper, aluminum, or solder etc. passed through a capillary 3 and an electrode. The leading end of the metallic wire 1 is melted by an energy produced consequent to discharging, thereby forming a metallic ball 2 at the leading end of the metallic wire 1. The capillary 3 is moved to position the metallic ball 2 above an electrode 4 of a semiconductor element 8, and bonding the metallic ball 2 is bonded to the electrode 4 by thermocompression bonding or thermocompression bonding using ultrasonic waves. The capillary 3 is moved up, shifted sideways and moving down, and the metallic wire 1 is bonded onto the metallic ball 2 bonded to the electrode 4 by the thermocompression bonding with or without ultrasonic waves. The capillary 3 is raised again, and the metallic wire 1 is pulled and broken so that the metallic ball 2 is left in a state bonded to the electrode 4, whereby the two-staged projecting bump 7 is formed on the electrode 4.

In the above first embodiment, the process of melting the leading end of the metallic wire 1 and forming the metallic ball 2 at the leading end of the metallic wire 1, or of pressing to bond the formed metallic ball 2 to the electrode 4 is different from in the prior art, so that a finished shape is different from the prior art which will be described hereinbelow.

As shown in FIG. 1, a part B immediately above the metallic ball 2 where crystal grains are turned coarse because of thermal influences by the discharging is generated only inside a position D (i.e., closer to metallic ball 2 than position D) where the metallic wire 1 is to be pulled and broken. In other words, part B is located inside a position D (breaking position) which is located at the end of the bond between the metallic ball 2 and metallic wire 1.

Due to this arrangement, a crystal grain structure of the metallic wire 1 behind the position D where the metallic wire 1 is to be pulled and broken becomes uniform. Thus, a breaking load becomes constant, whereby the metallic wire 1 is broken starting from the position D (breaking position) to be pulled and broken where the metallic wire is pressed by the capillary and consequently reduced in sectional area. In other words, the metallic wire 1 is always broken at the position D to be pulled and broken, thus forming the two-staged projecting bump 7 of a uniform shape.

For example, in the case where the metallic ball 2 of an original diameter 60 $\mu$m is made and then the two-staged projecting bump 7 is formed which has the metallic ball 2 of an approximately 80 $\mu$m diameter (a pedestal diameter) after being bonded onto the electrode 4 of the semiconductor element 8, a length from immediately above the metallic ball 2 to the position D to be pulled and broken, more specifically, to the position D where the bonding of the metallic ball 2 and metallic wire 1 terminates is approximately 80 $\mu$m.

Figure 2:
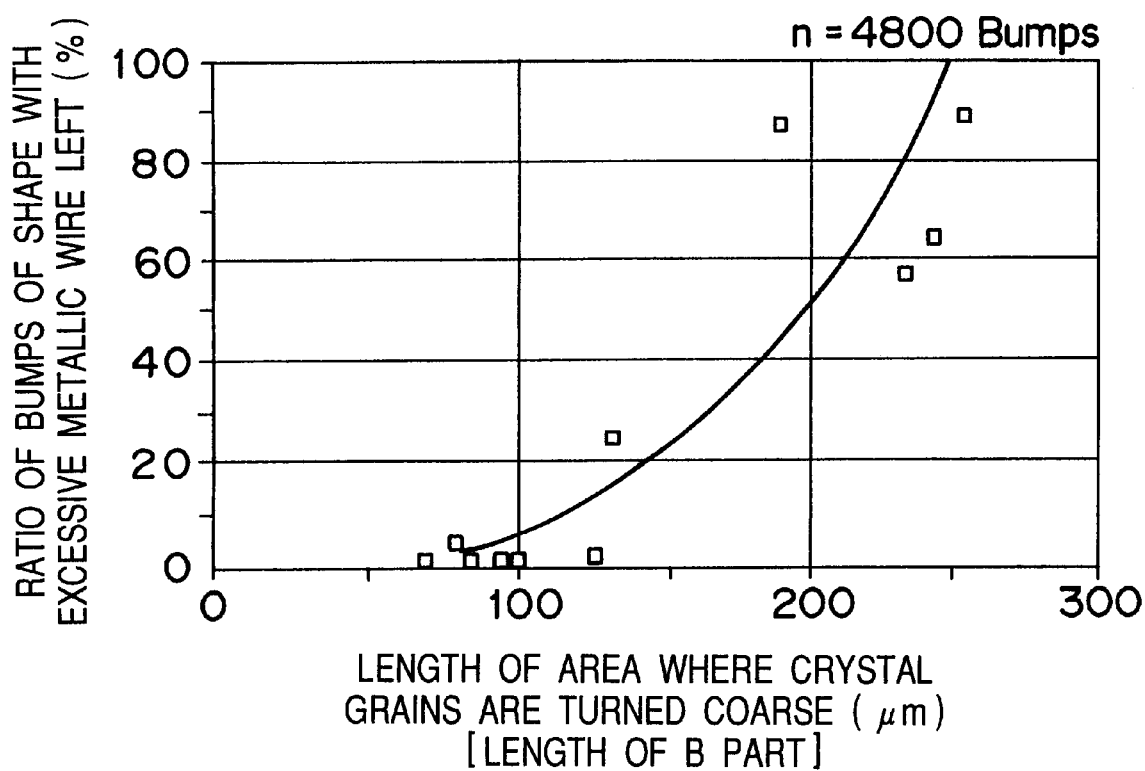
FIG. 2 is a diagram of a relationship of a range length of a part of the metallic wire immediately above the metallic ball where the crystal structure is turned coarse because of thermal influences by discharging and a formation ratio of defective two-staged projecting bumps.
Figure 16:
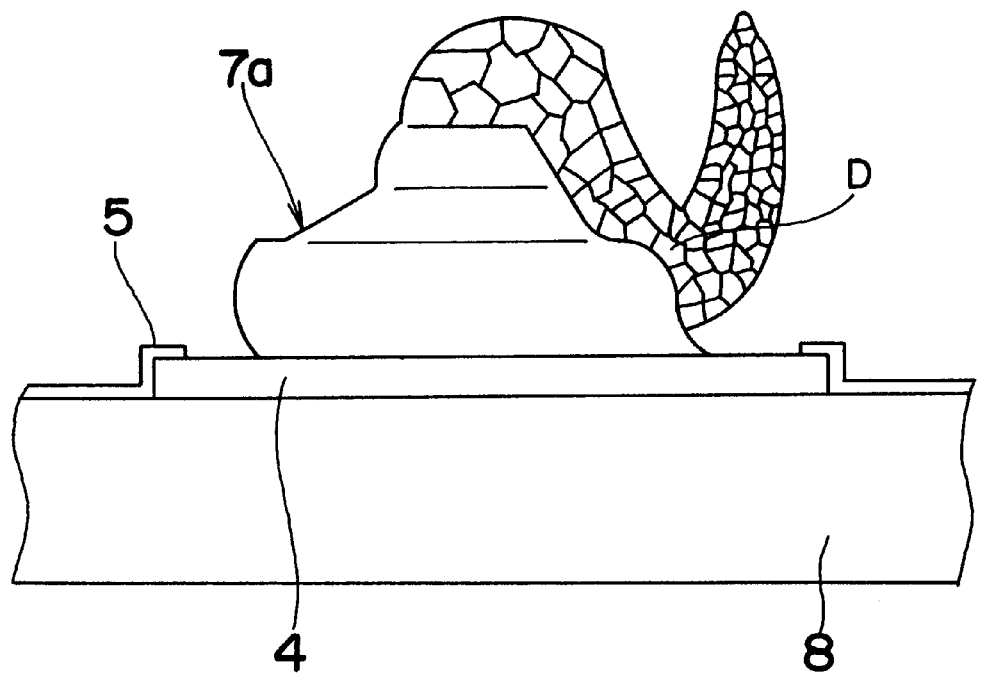
FIG. 16 is an explanatory diagram of a defective two-staged projecting bump.
Figure 17A:
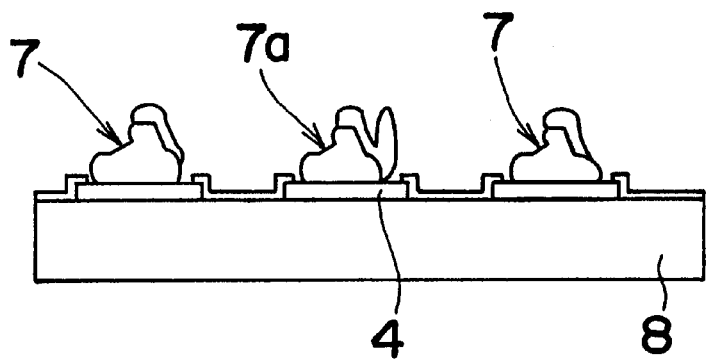
FIGS. 17A, 17B, and 17C are diagrams explanatory of an issue in the conventional two-staged projecting bump.
Figure 17B:
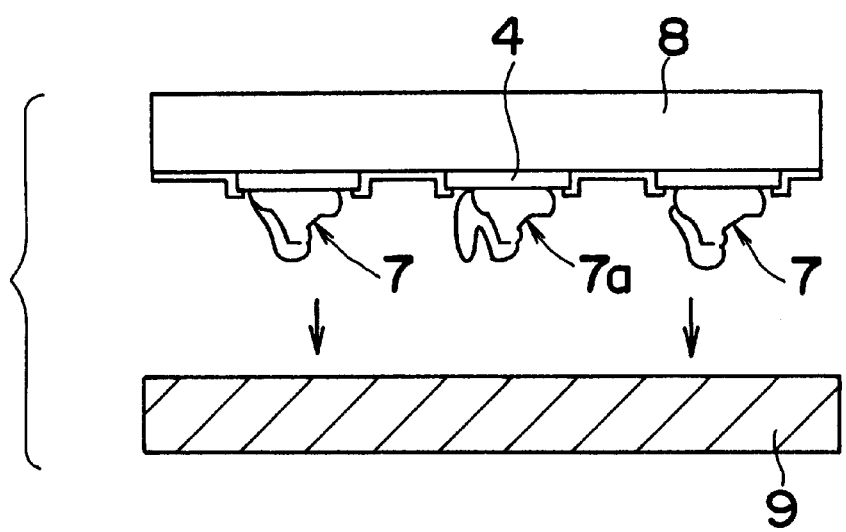
Figure 17C:
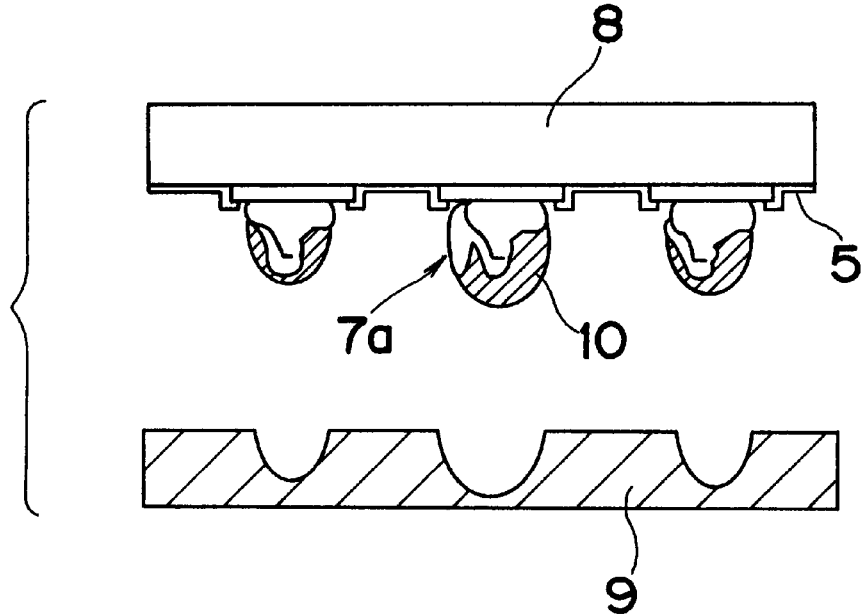
Figure 18:
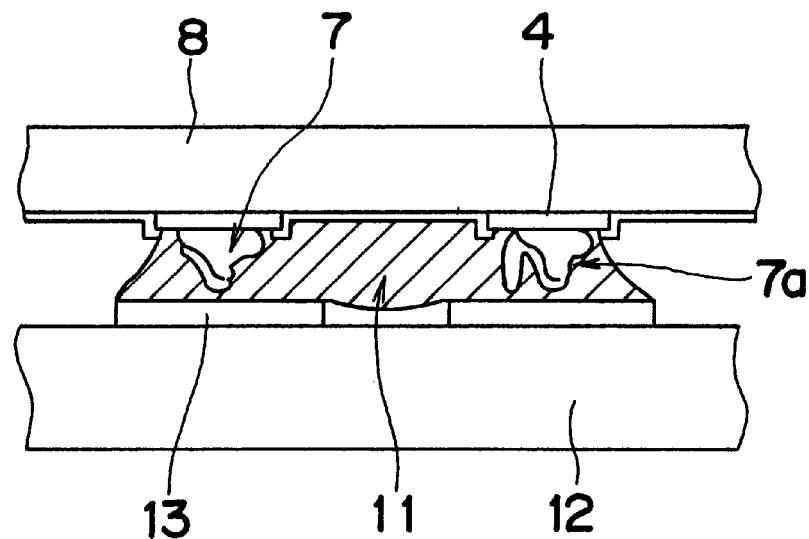
FIG. 18 is an illustrative diagram of the issue in the conventional two-staged projecting bump.
Figure 19:
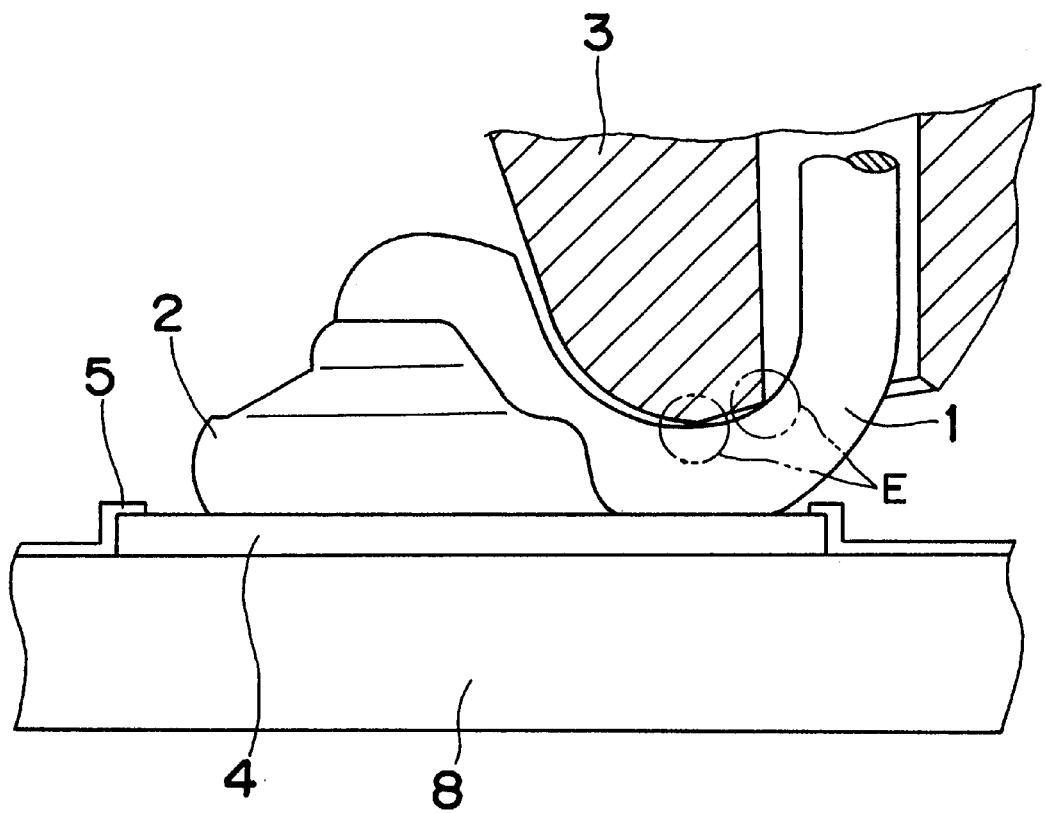
FIG. 19 is a state diagram of the metallic wire pressed by the capillary when the metallic wire is bonded to the metallic ball bonded to the electrode of the semiconductor element.

FIG. 2 shows a formation ratio of defective two-staged projecting bumps 7a having an excess of the metallic wire 1 left as shown in FIG. 16 among the two-staged projecting bumps formed by changing the length from immediately above the metallic ball 2 to the part B where the crystal grains become coarse because of the thermal influences by the discharging. FIG. 2 is obtained from average data of 4800 bumps.

In FIG. 2, an axis of abscissa represents the length immediately above the metallic ball 2 of the part B where the crystal grains become coarse because of the thermal influences of the discharging, and an axis of ordinate shows the formation ratio of two-staged projecting bumps with the excessive metallic wire 1 left.

As is found from FIG. 2, if the length from immediately above the metallic ball 2 to the part B where the crystal grains become coarse because of the thermal influences of the discharging is not larger than approximately 80 μm, no defective two-staged projecting bumps with the excessive metallic wire 1 left are formed. The above value of approximately 80 μm corresponds to the length from immediately above the metallic ball 2 to the position D where the metallic wire 1 is to be pulled and broken, namely, to the position D (breaking position) where the bonding of the metallic ball 2 and metallic wire 1 terminates.

In other words, when the part B right above the metallic ball 2 where the crystal grains become coarse because of the thermal influences of the discharging does not exceed the position D where the metallic wire 1 is to be pulled and broken, i.e., within the position D where the bonding of the metallic ball 2 to the metallic wire 1 terminates, the two-staged projecting bump 7 can be formed in the normal shape at all times. Since a uniform amount of conductive paste can be transferred to the two-staged projecting bumps 7 in the succeeding process, the reliability for mounting the semiconductor element to a circuit board is improved.

Working Example 1

Firstly, a concrete example wherein the process of melting the leading end of the metallic wire 1 thereby forming the metallic ball 2 on the leading end of the metallic wire 1 differently than the prior art will be depicted here.

Figure 3:
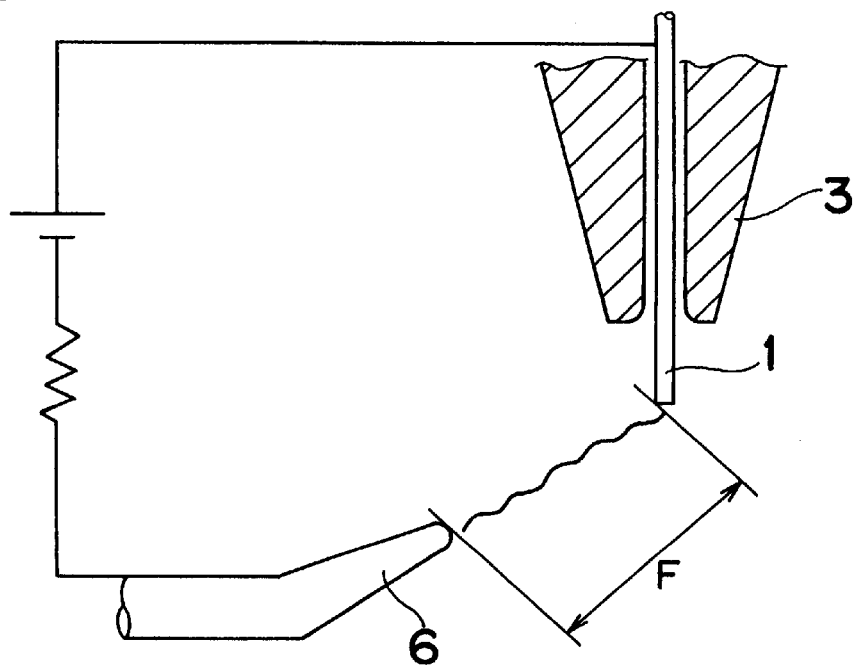
FIG. 3 is a diagram for explaining a process of forming the metallic ball on a leading end part of the metallic wire by the discharging.

As shown in FIG. 3, in forming the metallic ball 2 through discharging between the leading end of the metallic wire 1 passed through the capillary 3 and an electrode 6, an amount of an energy applied to the leading end of the metallic wire 1 is equal to: (a current value)×(a voltage value)×(a discharging time). In this case, while the voltage value is determined by a distance F between leading ends of the electrode 6 and metallic wire 1, the voltage value can be considered constant at all times because the distance F is always constant at the discharging time. Therefore, the applied energy forms a metallic ball 2 with a diameter that is proportional to the discharging time and current value, although countless combinations of the discharging time and current value are conceivable to form metallic balls 2 of the same diameter.

Figure 4:
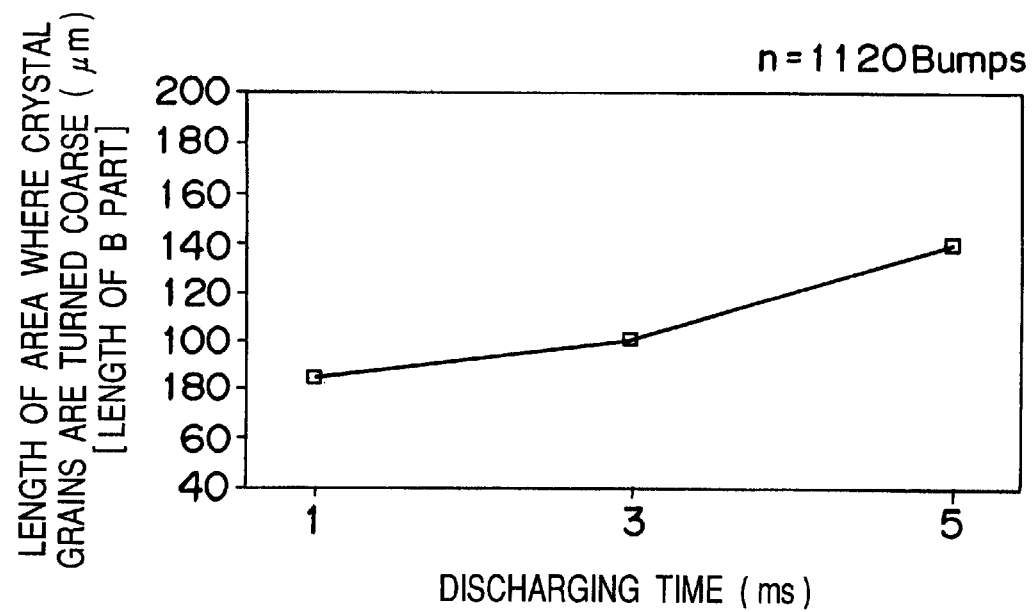
FIG. 4 is a diagram of a relationship of a discharging time and the range length of the part of the metallic wire immediately above the metallic ball where the crystal structure is turned coarse because of thermal influences by the discharging.

However, among the above two parameters in discharging, namely, the discharging time and current value, what influences the length of an area of the metallic wire where the crystal grains become coarse due to the thermal influences by the discharging is the discharging time. FIG. 4 is a graph of a relationship of the discharging time on an axis of abscissa and a distance represented on an axis of ordinate from immediately above the metallic ball 2 to the area where the crystal grains are coarse. In this case, the metallic ball is formed in a diameter of 60 μm, and the current value and voltage value are 40 mA and 400 V. FIG. 4 is average data of 1120 bumps.

It is found from FIG. 4 that the length of the area where the crystal grains become coarse is proportional to the discharging time, and that the shorter the discharging time is, the shorter the area length becomes.

Meanwhile, the formation ratio of the defective two-staged projecting bumps 7a is proportional to the length of the area where the crystal grains become coarse, as confirmed from FIG. 2. Therefore, the two-staged projecting bumps 7 in the normal shape of FIG. 1 can be obtained with good reproducibility if the discharging time is controlled so as to set the length of the area where the crystal grains become coarse to such a length as not to cause the defective two-staged projecting bumps 7a with the excessive metallic wire 1 left.

For instance, when the metallic ball 2 having an original diameter of 60 μm is made and bonded onto the electrode 4 of the semiconductor element 8 to have an approximately 80 μm diameter (pedestal diameter) in the two-staged projecting bump 7, if the length of the area where the crystal grains become coarse is made not larger than approximately 80 μm, the defective two-staged projecting bump 7a is avoided.

The above value of approximately 80 μm corresponds to the length from immediately above the metallic ball 2 to the position D to be pulled and broken, namely, to the termination position D of the bonding between the metallic ball 2 and metallic wire 1. Therefore, if the metallic ball is formed in not longer than 1 ms discharging time, the area length where the crystal grains are rough is restricted to 80 μm or shorter, thereby realizing the normal two-staged projecting bumps 7 with good reproducibility.

Figure 5:
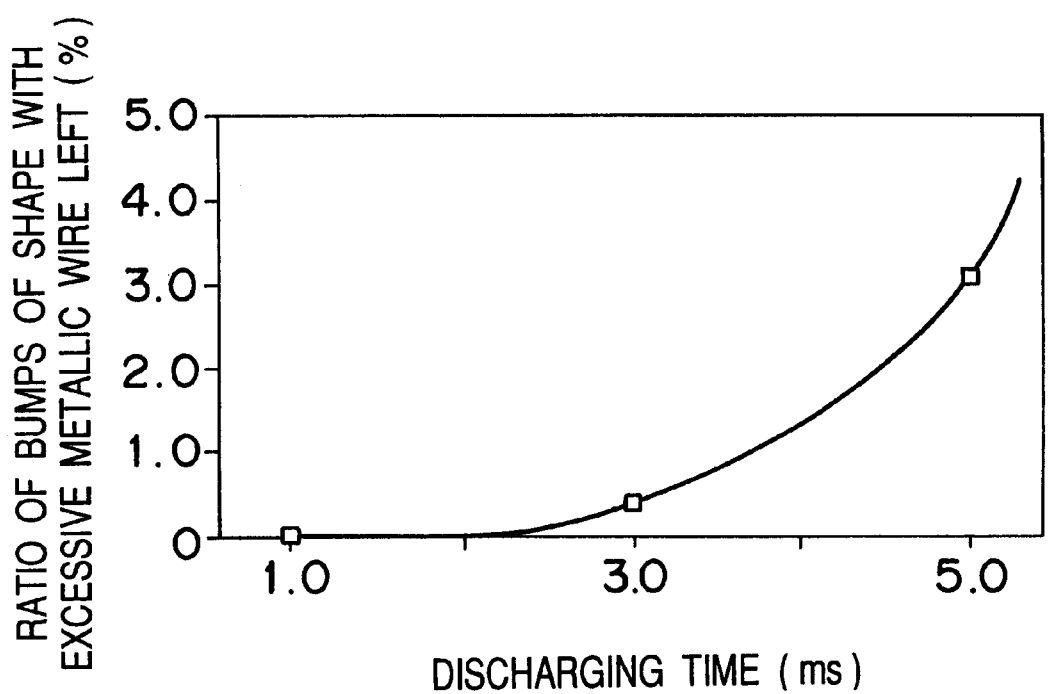
FIG. 5 is a diagram of a relationship of the discharging time and the formation ratio of defective two-staged projecting bumps.

In FIG. 5, the axis of abscissa represents the discharging time and the axis of ordinate represents the formation ratio of the defective two-staged projecting bumps 7a having the excessive metallic wire left. From this FIG. 5, it is found that when the length of the area where the crystal grains become coarse is controlled by the discharging time so as to set the length at a distance that will not bring about the defective two-staged projecting bumps 7a with the excessive metallic wire 1 left, specifically, a length not larger than the length from immediately above the metallic ball 2 to the position D (breaking position) to be pulled and broken (i.e., to the terminating position D of the bond between the metallic ball 2 and metallic wire 1), the two-staged projecting bumps 7 in the normal shape can be formed with good reproducibility.

It is accordingly important to select such a discharging time that the part B where the crystal grains become coarse due to the thermal influence of the discharging is accommodated in length within the area from immediately above the metallic ball 2 to the position D where the metallic wire 1 is to be pulled and broken in FIG. 1, to form the metallic ball 2.

Working Example 2

This working example 2 is a concrete example wherein the processes of pressing and bonding the formed metallic ball 2 to the electrode 4 are different from the prior art. FIG. 6B shows a state immediately before the metallic wire 1 is pulled and broken at the final process.

Instead of controlling the discharging time when the metallic ball 2 is formed as in the previous working example 1, a pressure, a pressing speed, a bonding time, a bonding temperature, etc. when the metallic ball 2 is bonded to the electrode 4 of the semiconductor element 8 are controlled. As a result, the part B where the crystal grains are turned coarse because of the thermal influences at the forming time of the metallic ball 2 is positioned inside the position D (i.e., closer to metallic ball 2 than position D) where the bonding of the metallic ball 2 to the metallic wire 1 terminates, in the same fashion as in the two-staged projecting bump shown in FIG. 1. Such positioning is carried out by the following method.

The method will be discussed with reference to FIGS. 6A and 6B.

Figure 6A:
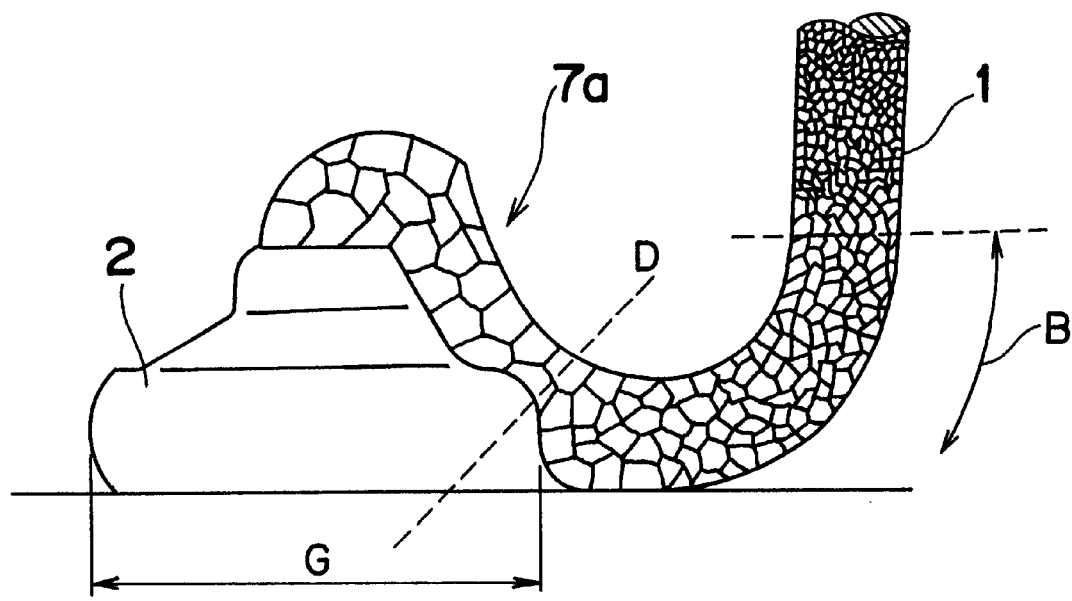
FIGS. 6A, 6B are diagrams of a relationship between a diameter of a bump pedestal and the area (recrystallized area) of the metallic wire immediately above the metallic ball where the crystal structure is turned coarse because of thermal influences by the discharging.
Figure 6B:
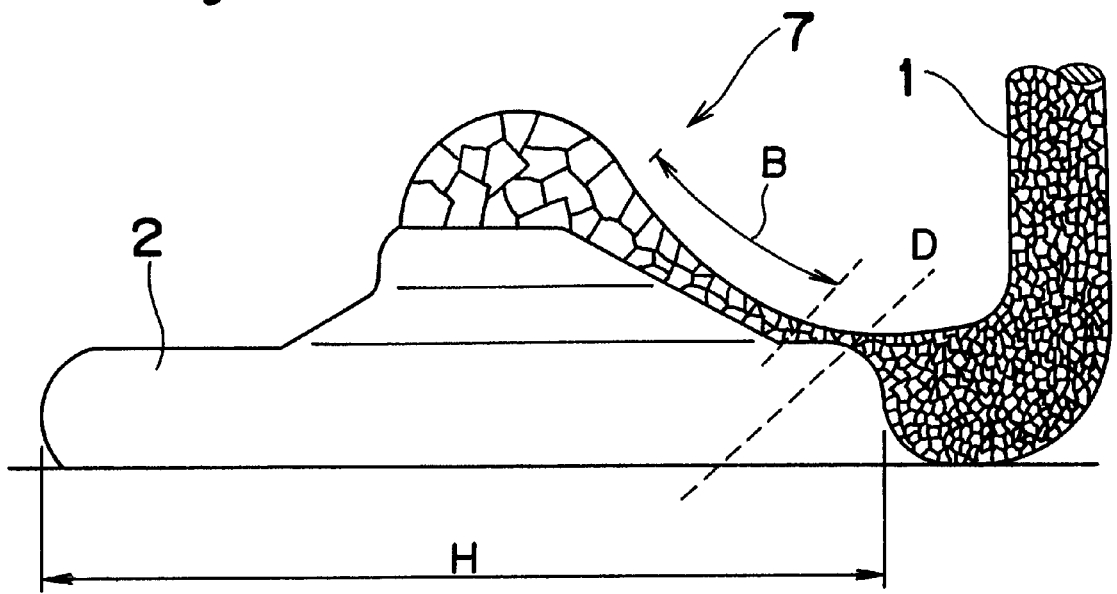
Figure 13:
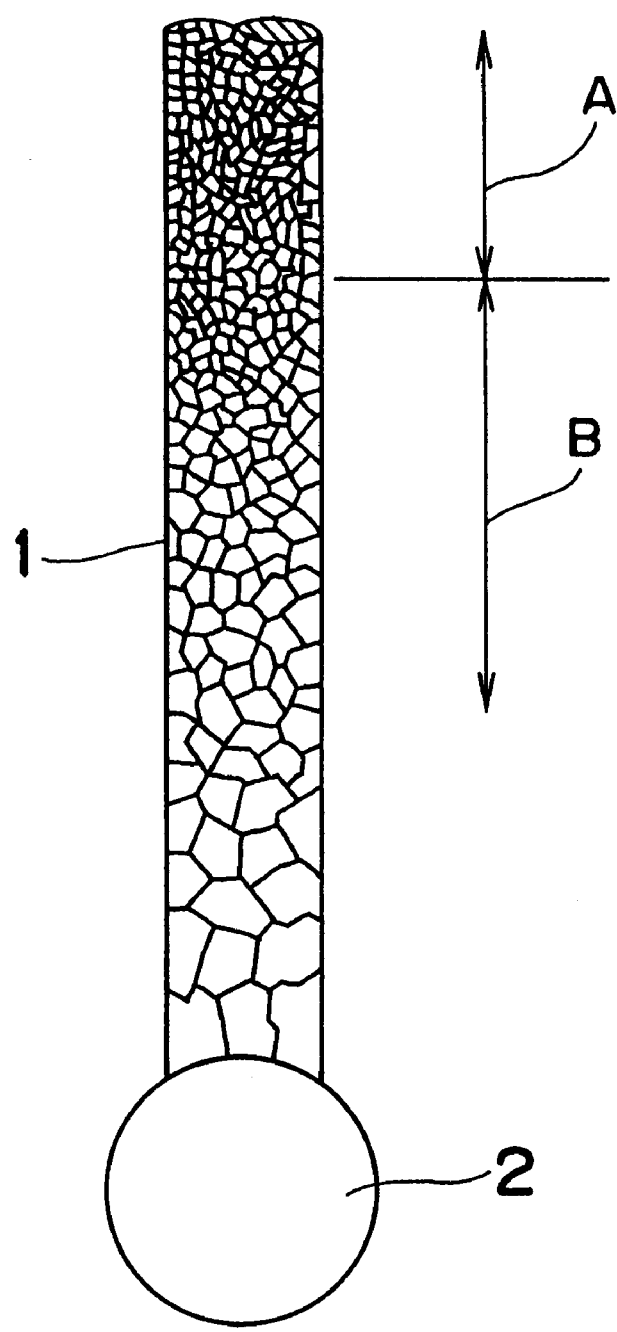
FIG. 13 is a state diagram of the crystal structure of the metallic wire after the metallic ball is formed at a leading end of the metallic wire.
Figure 14:
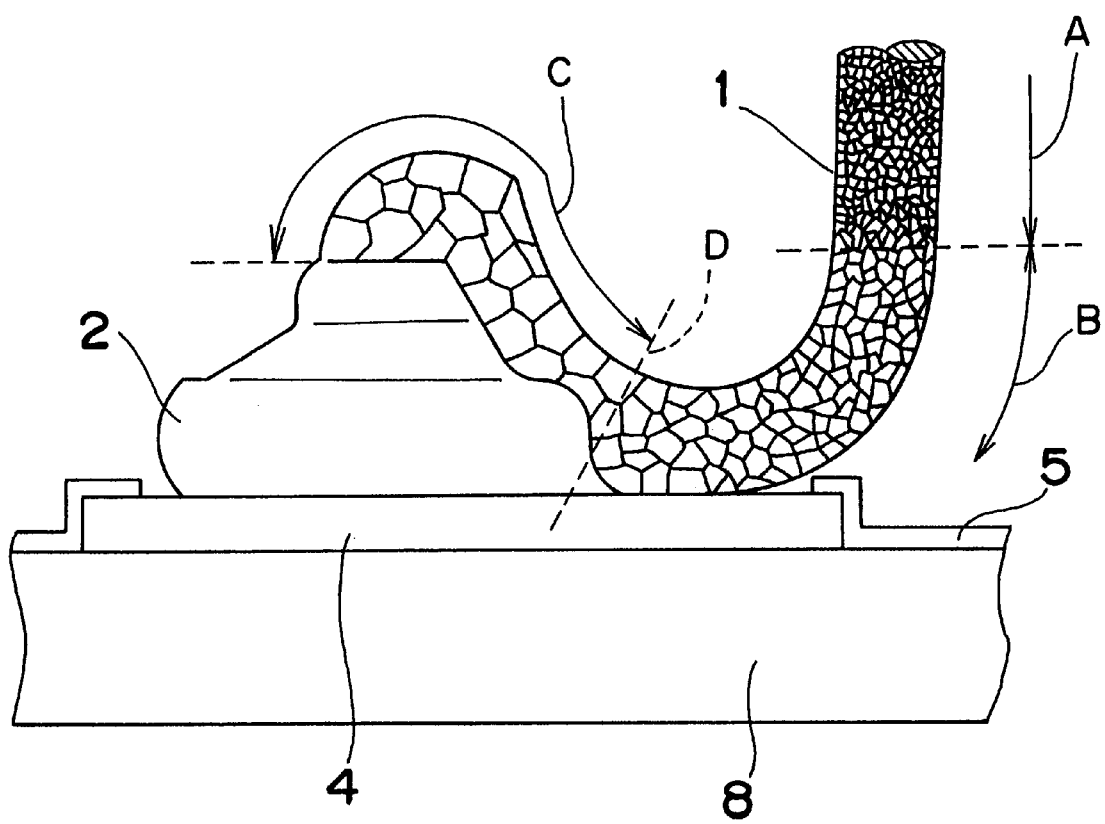
FIG. 14 is a state diagram of the crystal structure of the metallic wire before being pulled and broken in the conventional process of forming the two-staged projecting bump.
Figure 15:
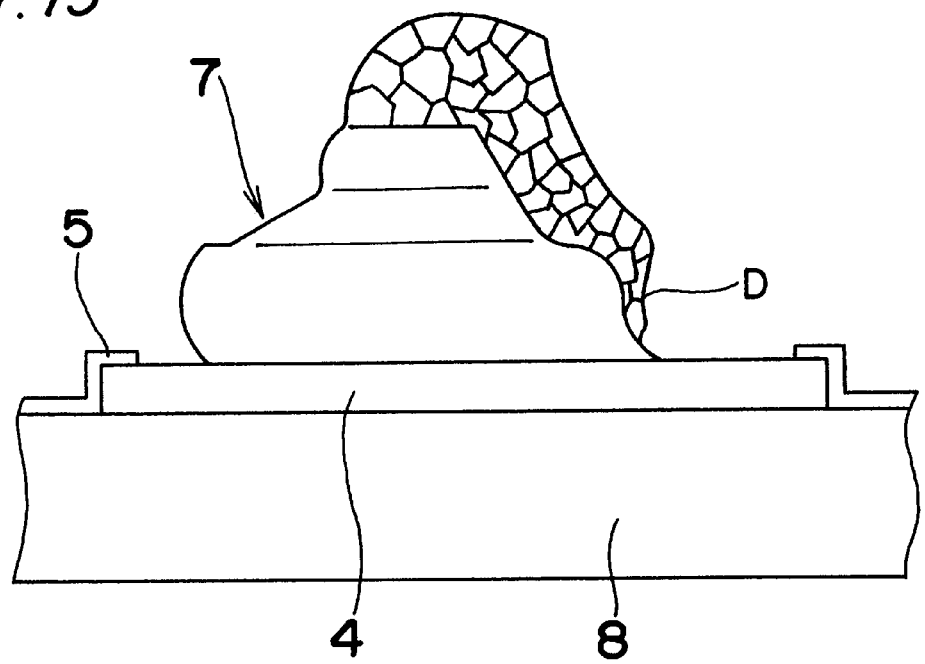
FIG. 15 is a diagram explanatory of the conventional two-staged projecting bump of a normal shape.

In order to form the two-staged projecting bumps shown in FIGS. 6A, 6B, metallic wires 1 are used which have the same length as the length immediately above the metallic ball 2 of the part B (referring to FIG. 13) where the crystal grains become coarse due to the thermal influence by the discharging. However, the diameter (pedestal diameter) of the metallic ball 2 after the two-staged projecting bump is formed is different between FIGS. 6A and 6B.

The pedestal diameter in the example of FIG. 6A is G, while that in the example of FIG. 6B is H, so that G<H. In the two-staged projecting bumps of FIGS. 6A and 6B, the part B where the crystal grains become coarse under the thermal influences of the discharging from immediately above the metallic ball 2 expands beyond the position D to be pulled and broken, i.e., the terminating position D of the bonding between the metallic ball 2 and metallic wire 1. To the contrary, in the example of FIG. 6B, the part B where the crystal grains become coarse under the thermal influences of the discharging from immediately above the metallic ball 2 is accommodated inside the part D to be pulled and broken.

From the result of FIG. 2, therefore, the defective two-staged projecting bump 7a with the excessive metallic wire 1 left is produced in the shape of FIG. 6A, whereas the good two-staged projecting bump without the excessive metallic wire 1 left is obtained in the shape of FIG. 6B.

As above, the length from immediately above the metallic ball 2 to the position D where the wire is to be pulled and broken (that is, the position D where the bonding of the metallic ball 2 and metallic wire 1 terminates) can be controlled by the pedestal diameter of the two-staged projecting bump. So long as the shape is designed so that the part where the crystal grains become coarse and the breaking strength is reduced to nearly half is inside the position D (breaking position), the defective two-staged projecting bump 7a can be prevented. In addition, the pedestal diameter is controllable by the pressure, pressing speed, bonding time, bonding temperature, etc., when the metallic ball is bonded to the electrode 4 of the semiconductor element 8.

SECOND EMBODIMENT

A bump and a method of forming the same according to a second embodiment will be described with reference to FIGS. 7–9.

The two-staged projecting bump of the second embodiment is formed basically using the same procedures as indicated in FIGS. 12A–12F. That is, while a high voltage is applied between the leading end of the metallic wire 1 passed through the capillary 3 and the electrode, the leading end of the metallic wire 1 is melted by the energy generated by the discharge, thereby forming the metallic ball 2 at the leading end thereof The capillary 3 is moved to position the metallic ball 2 on the electrode 4 of the semiconductor element 8. The metallic ball 2 is bonded to the electrode 4 by thermocompression bonding or ultrasonic thermocompression bonding. Then the capillary 3 is raised, moved sideways and descended. The metallic wire 1 is bonded to the metallic ball 2 bonded to the electrode 4 by thermocompression bonding or ultrasonic thermocompression bonding. Thereafter, the capillary 3 is raised again and the metallic wire 1 is pulled and broken with the metallic ball 2 left in the bonded state to the electrode 4. In the process, a two-staged projecting bump is formed on the electrode 4.

Figure 7:
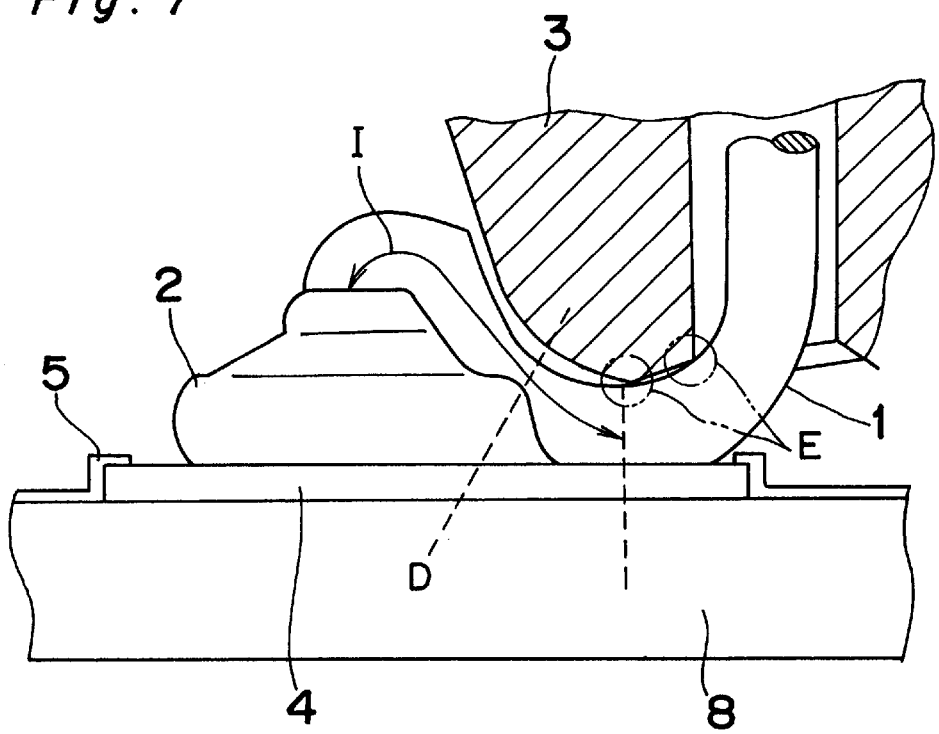
FIG. 7 is a diagram of a state where the metallic wire is pressed by a capillary when the metallic ball bonded to an electrode of a semiconductor element is bonded to the metallic wire in a second embodiment of the present invention.

In the above-described process, when the metallic ball 2 is bonded to the electrode 4 of the semiconductor element 8, and the capillary 3 is moved up and sideways, then moved down so as to bond the metallic wire 1 onto the metallic ball 2 bonded to the electrode 4, the metallic wire 1 is caught between the electrode 4 of the semiconductor element 8 or the semiconductor element itself and the capillary 3 as denoted by E positions in FIG. 7. As a result, the neck 14 is generated in the metallic wire 1 as in FIG. 20, enabling the formation of the two-staged projecting bump 7 of good shape. The process will be detailed hereinbelow.

A hardness of the metallic wire 1 at the E position where the neck 14 is formed, that is, a hardness at a position of the metallic wire which is at a distance I immediately above the metallic ball 2 is set to be not smaller than ⅔ of a hardness of the metallic wire at a part not thermally influenced by the discharge.

In this case, a size of the neck 14 generated in the metallic wire 1 due to the pressing by the capillary 3 is dependent on the hardness of the metallic wire 1 of the neck part. The smaller the hardness, the bigger the neck is. On the other hand, the size of the neck 14 influences the breaking load at a position on th wire. The bigger the neck 14 is, the smaller the breaking load is. If the hardness of the part of the metallic wire where the neck 14 is formed, in other words, the hardness of the part of the metallic wire 1 spaced the distance I from the metallic ball 2 is not smaller than ⅔ of the hardness of the metallic wire of the part not thermally influenced by the discharging, a breaking strength of the neck part 14 (E position) with the break starting from the size of the neck 14 formed at the hardness becomes larger than a breaking strength of the position D where the metallic wire 1 is to be pulled and broken, that is, the position D where the bond between the metallic ball 2 and metallic wire 1 terminates. Then, the metallic wire 1 is broken at the position D to be pulled and broken at all times, thus producing the two-staged projecting bump 7 of uniform shape.

Figure 8:
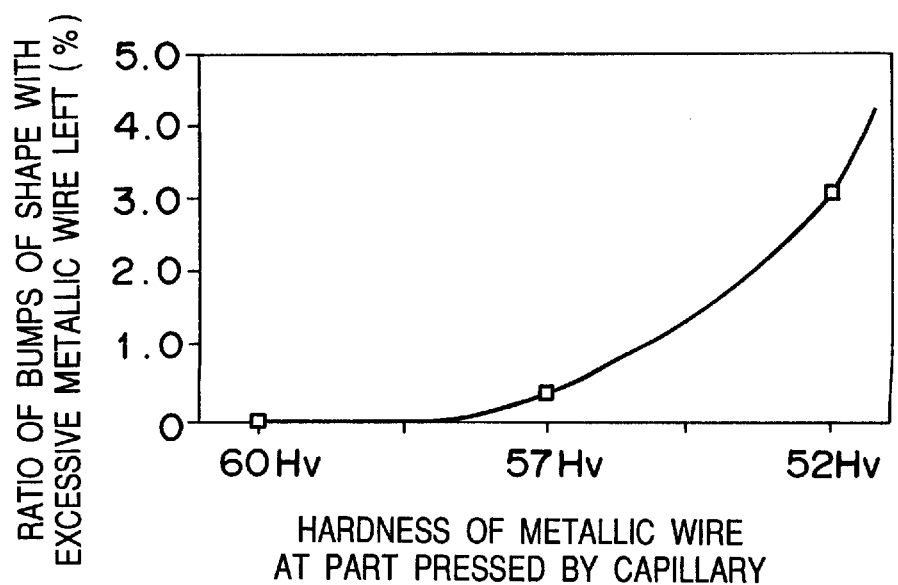
FIG. 8 is a graph of a relationship of a hardness of the metallic wire at a part pressed by the capillary and a formation ratio of defective two-staged projecting bumps.

FIG. 8 is a graph of a relationship of the hardness of the position where the neck 14 is formed which is indicated on an axis of abscissa and the formation ratio of defective two-staged projecting bumps 7a with the remaining excessive metallic wire 1 which is represented on an axis of ordinate. The part of the metallic wire 1 used in the experiment and not thermally influenced by the discharging has a Vickers hardness of 80 Hv. Its is found from FIG. 8 that if the hardness of the part where the neck 14 is formed is not smaller than ¾=(60 Hv/80 Hv) of the hardness of the not-thermally-influenced part of the metallic wire, the defective two-staged projecting bump 7a is not formed. However, since the size of the neck 14 varies depending on a shape of the capillary 3 and bonding conditions, the hardness of the E part is set to be ⅔ or larger than the hardness of the not-thermally-influenced part so as to leave some margin.

Accordingly, the amount of the-conductive paste transferred to each two-staged projecting bump in the next process becomes uniform, and therefore the semiconductor element is mounted to the circuit board with improved reliability.

Hereinbelow will be described, based on FIG. 9, a method of forming the two-staged projecting bump wherein the hardness of the E position of the metallic wire 1 where the neck 14 is formed (namely, the hardness at the position spaced a distance I from the metallic ball 2) is not smaller than ⅔ of the hardness of the not thermally influenced part of the metallic wire 1.

Figure 9:
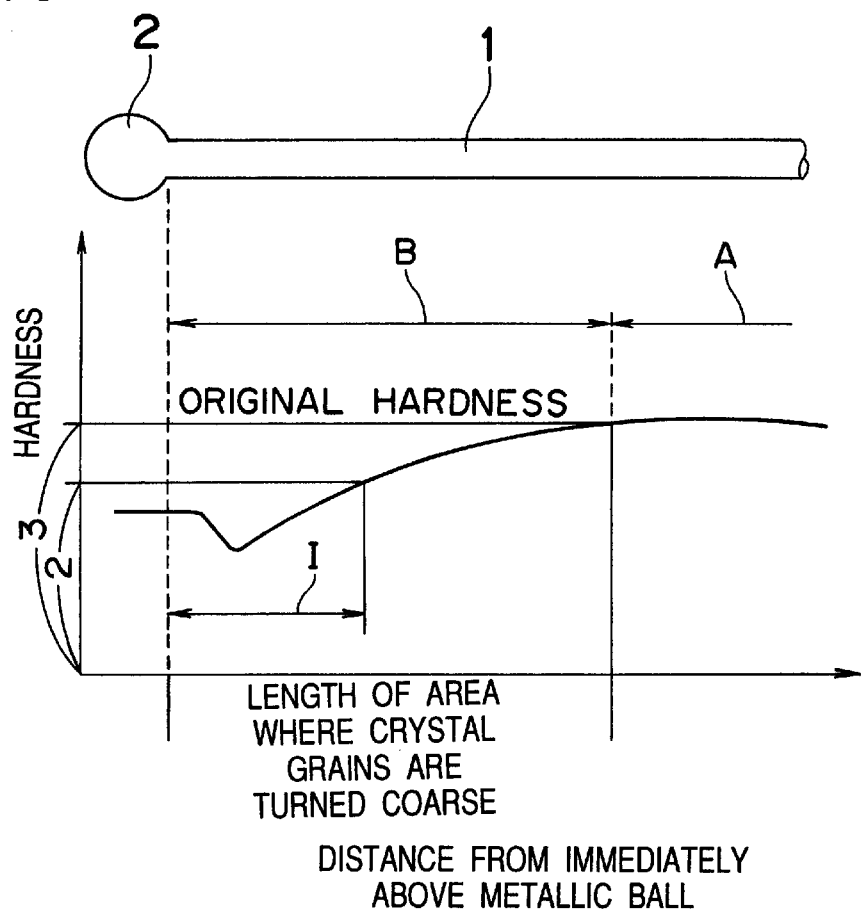
FIG. 9 is a diagram for explaining a hardness distribution of the metallic wire immediately above the metallic ball.

FIG. 9 is a graph of a hardness distribution of the metallic wire 1 measured in its longitudinal direction from immediately above the metallic ball 2 after the metallic ball 2 is formed on the leading end of the metallic wire 1 by the discharging. From this FIG. 9, the hardness of the part B where crystal grains are made coarse because of thermal influences by the discharging is increased as a distance of the part B is increased from a position immediately above the metallic ball 2. Therefore, the length of the B part should be shortened so as to set the hardness at the I position where the neck 14 is formed high by the pressing of the capillary 3.

That is, when the metallic ball 2 is formed, the length of the B part should be controlled so that the hardness at the I position is at $2/3$ of the original hardness of the metallic wire 1 without thermal influences. In addition, the length of the B part of coarse crystal grains can be controlled by the discharging time. Specifically, when the metallic ball 2 is formed, such discharging time that makes the hardness at the I position not smaller than $2/3$ of the original hardness of the metallic wire 1 without being thermally influenced should be selected to form the metallic ball 2.

THIRD EMBODIMENT

Figure 10:
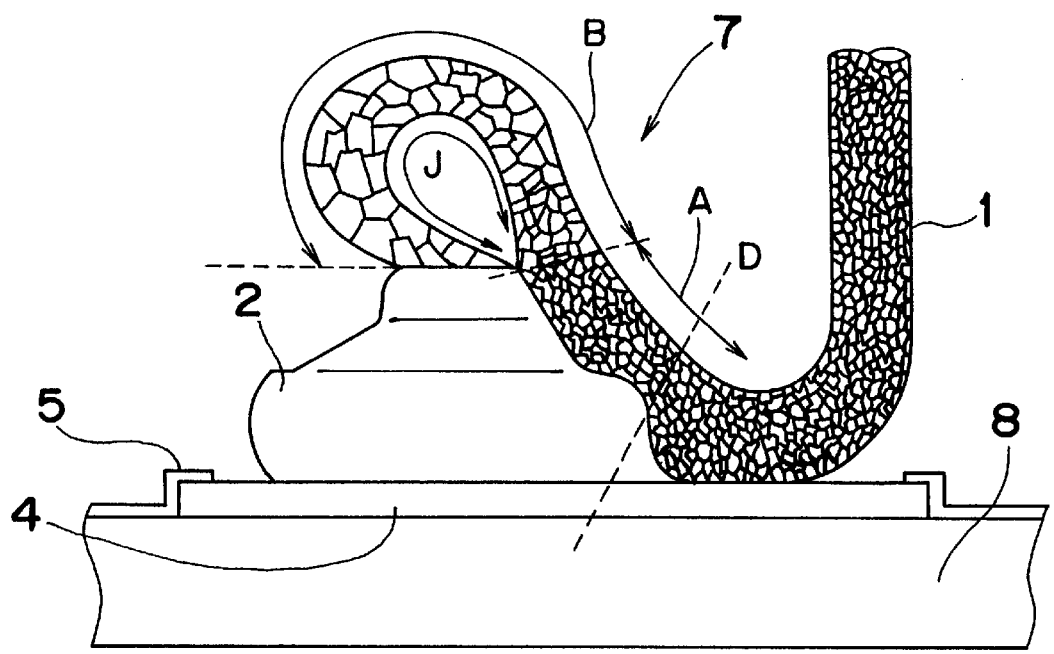
FIG. 10 is a state diagram of the crystal structure of the metallic wire immediately above the metallic ball in a two-staged projecting bump according to a third embodiment of the present invention.
Figure 11A:
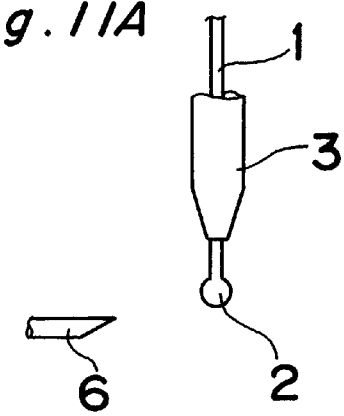
FIGS. 11A, 11B, 11C, 11D, 11E, and 11F are explanatory diagrams of procedures for forming the two-staged projecting bump of the third embodiment.
Figure 11B:
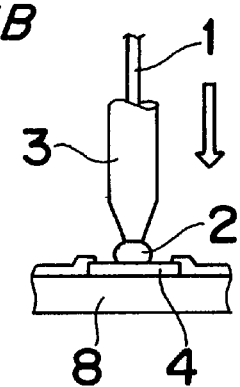
Figure 11C:
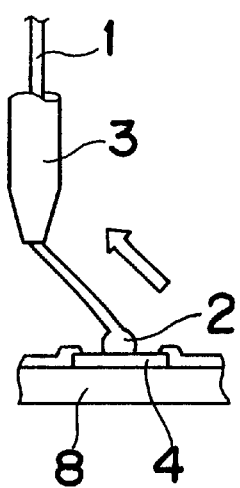
Figure 11D:
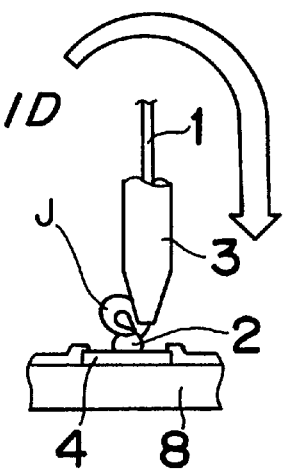
Figure 11E:
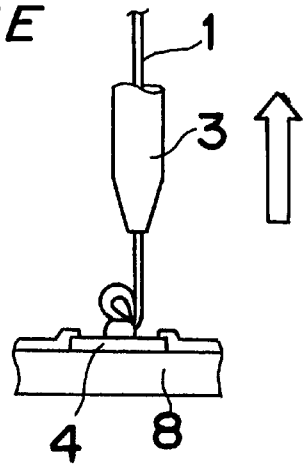
Figure 11F:
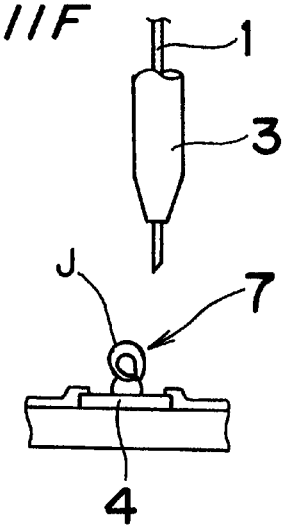
Figure 12A:
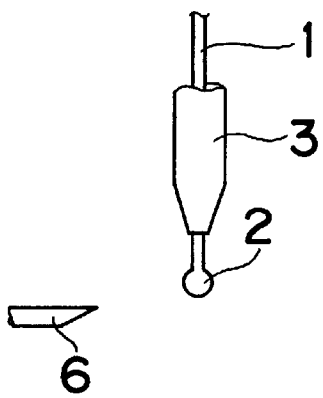
FIGS. 12A, 12B, 12C, 12D, 12E, and 12F are explanatory diagrams of procedures for forming a conventional two-staged projecting bump.
Figure 12D:
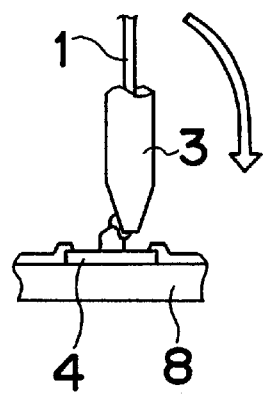
Figure 12B:
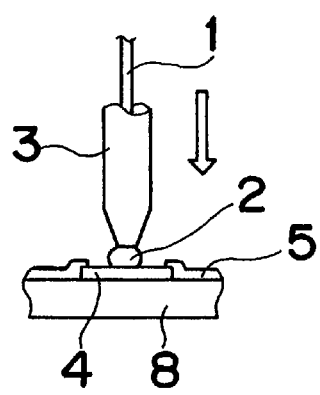
Figure 12E:
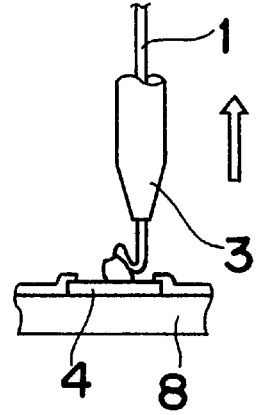
Figure 12C:
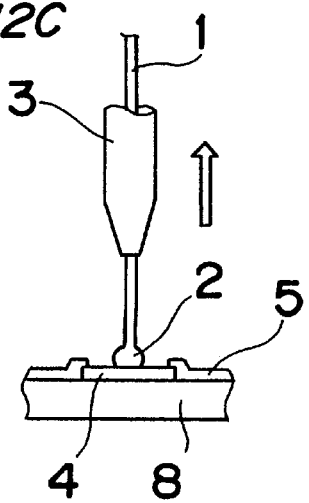
Figure 12F:
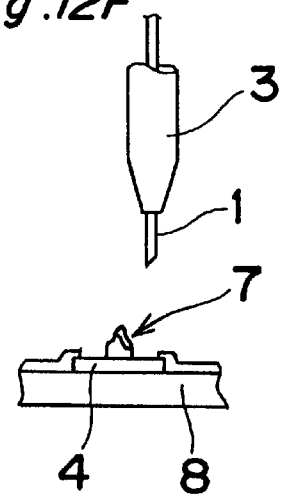

FIGS. 10–11F indicate a bump and a method for forming the bump according to a third embodiment.

FIG. 10 illustrates a state immediately before the metallic wire 1 is pulled and broken at the final step of the formation process for the two-staged projecting bump of the third embodiment. Although the process proceeds in the same manner as in the first and second embodiments until the metallic ball 2 is bonded to the electrode 4, the metallic wire 1 immediately above the metallic ball 2 is finished in a loop J according to the third embodiment. In other words, the bump includes the loop-shaped part J where the metallic ball 2 and metallic wire 1 are not bonded with each other.

In the embodiment, since the metallic wire 1 immediately above the metallic ball 2 is in the loop shape, a distance D from immediately above the metallic ball 2 to a position D where the metallic wire 1 is to be pulled and broken (that is, to an edge part of the metallic ball 2 bonded onto the electrode 4 of the semiconductor element 8) can be secured optionally long. Therefore, the metallic wire part B where the crystal grains are thermally influenced by the discharge and turned coarse can be accommodated inside the position D (break position) where the metallic wire 1 is to be pulled and broken. The metallic wire 1 is accordingly surely broken at the position D to be pulled and broken at all times, so that the two-staged projecting bump is formed in uniform shape.

Figure 20:
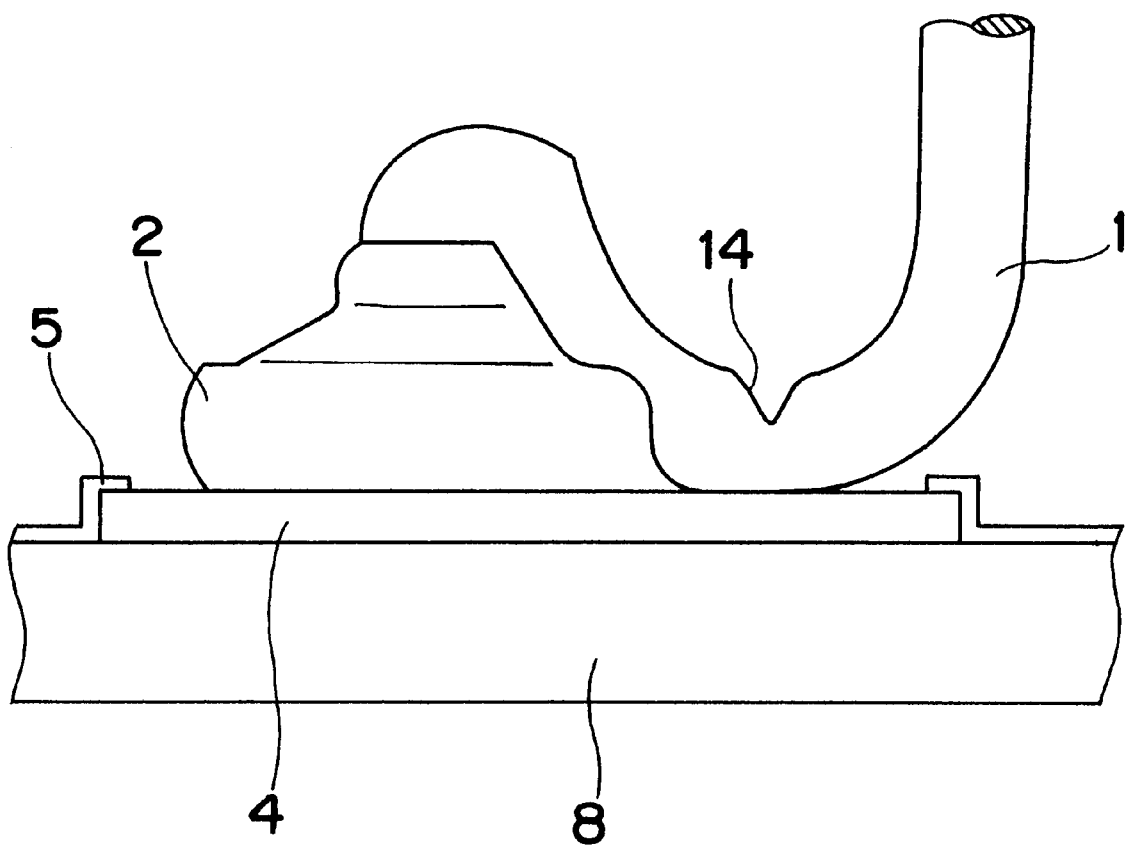
FIG. 20 is a diagram explanatory of a narrow part, that is, neck of the metallic wire brought about when the metallic wire is pressed by the capillary at the bonding time of the metallic wire to the metallic ball bonded to the electrode of the semiconductor element.

In the process wherein the metallic ball 2 is bonded to the electrode 4 of the semiconductor element 8, and the capillary 3 is raised, moved sideways and lowered to bond the metallic wire 1 to the metallic ball 2 bonded to the electrode 4 by thermocompression bonding or ultrasonic thermocompression bonding, as shown in FIGS. 7 and 20, the metallic wire 1 may be caught between the electrode 4 of the semiconductor element 8 or semiconductor element 8 itself and the capillary 3 thereby to bring about the neck 14. However, because of the provision of the loop shape, the distance I from immediately above the metallic ball 2 to the neck 14 can be adjusted by optionally changing the loop shape. Then, the hardness of the metallic wire 1 of the neck 14 formed by the pressing of the capillary 3 can be controlled to be not smaller than $2/3$ of the hardness of the metallic wire not thermally influenced by the discharging. Accordingly, the metallic wire 1 can be broken always at the position D (break position) to be pulled and broken, and the two-staged projecting bump can be obtained in uniform shape.

For forming the normal two-staged projecting bump, a combined way of control may be performed in addition to the control of the loop shape. For example, a control of the length of the B part where the crystal grains are turned coarse because of thermal influences by the discharging time, or a control of the pedestal diameter of the bump to the length from immediately above the metallic ball to the position D where the metallic wire is to be pulled and broken, etc. may be combined.

FIGS. 11A–11F show a process of forming the two-staged projecting bump having the loop part J.

First, as shown in FIG. 11A, the metallic wire 1 of gold, copper, aluminum, solder or the like is passed through the capillary 3 of ceramic or ruby. The leading end of the passed metallic wire 1 and an electrode 6 as a torch are discharged therebetween, thereby forming the metallic ball 2.

In FIG. 11B, the metallic ball 2 is pressed on the preheated electrode 4 of the semiconductor element 8, to which ultrasonic vibrations are applied. The metallic ball 2 is bonded to the electrode 4 by the action of the temperature, pressure, and ultrasonic vibrations. A reference numeral 5 is a passivation film for protecting an active face of the semiconductor element 8.

In FIG. 11C, the capillary 3 is moved to a direction apart from a moving direction thereof when the metallic wire 1 is bonded to the metallic ball 2 in FIG. 11D, so as to describe a circular locus or an elliptic locus.

The loop part J is formed by the metallic wire 1 through the movement of the capillary 3 in FIGS. 11C and 11D. In FIG. 11D, the metallic wire 1 is brought in contact with the metallic ball 2 and bonded to the metallic ball 2 by the action of the temperature and pressure or by the action of the temperature, pressure and ultrasonic vibrations. Thereafter, as shown in FIG. 11E, the capillary 3 is raised. The metallic wire 1 is pulled and broken as shown in FIG. 11F, whereby the two-staged projecting bump is completely formed.

In the two-staged projecting bump of the semiconductor element and the method for forming the bump of the present invention, the area (recrystallized area) immediately above the metallic ball of the metallic wire for forming the two-staged projecting bump on the electrode of the semiconductor element where the crystal grain structure is turned coarse because of thermal influences by the discharge is set not to exceed the distance from immediately above the metallic ball to the part where the metallic wire is to be pulled and broken. In other words, the area is set to be accommodated inside the boundary of the bond between the metallic wire and metallic ball. Therefore, the metallic wire is always broken at the position to be pulled and broken, and the two-staged projecting bump can be formed in uniform shape.

Along with the above-described effect, when the conductive paste is transferred onto the thus-formed two-staged projecting bumps by a transfer method, the amount of the conductive paste transferred to each bump is less varied. Therefore, the bonding reliability when the semiconductor element is mounted to the circuit board is improved.

The entire disclosure of Japanese Patent Application No. 8-95774 filed on Apr. 18, 1996, including specification, claims, drawings, and summary are incorporated herein by reference in its entirety.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A two-stage projecting bump comprising:
an electrode;
a metallic ball formed by melting a leading end of a metallic wire extending through a capillary, wherein a thermally-influenced portion of said metallic wire adjacent to said metallic ball has coarse crystal grains produced during formation of said metallic ball, said metallic ball being bonded to said electrode; and
a metallic wire portion bonded to said metallic ball by moving the capillary toward a side of said metallic ball and downward so that a bond between said metallic wire portion and said metallic ball terminates at a termination position, said metallic wire portion being formed by pulling and breaking the metallic wire such that said metallic wire portion remains bonded to said metallic ball, wherein said thermally-influenced portion is located entirely inside said termination position.

2. A method of forming a two-staged projecting bump, comprising:
passing a metallic wire through a capillary;
melting a leading end of the metallic wire so as to form a metallic ball and a thermally-influenced portion of the metallic wire adjacent to the metallic ball, wherein the thermally-influenced portion has coarse crystal grains;
bonding the metallic ball to an electrode of a semiconductor element;
moving the capillary toward a side of the metallic ball and downward so as to produce a bump-forming portion of the metallic wire;
bonding the bump-forming portion of the metallic wire to the metallic ball;
pressing the capillary against the metallic wire at a breaking position so as to reduce a cross-sectional area of the metallic wire at the breaking position; and
pulling the metallic wire so as to break the metallic wire at the breaking position such that the bump-forming portion remains bonded to the metallic ball, wherein said melting of the leading end of the metallic wire is controlled such that the thermally-influenced portion is located entirely inside the breaking position.

3. The method of claim 2, wherein said melting of the leading end of the metallic wire is controlled by controlling a discharging time defined as a time when a voltage is impressed between the leading end of the metallic wire and a metallic ball-formation electrode.

4. A bump formed according to the method of claim 3.

5. A bump formed according to the method of claim 1.

6. A method of forming a two-staged projecting bump, comprising:
passing a metallic wire through a capillary;
melting a leading end of the metallic wire so as to form a metallic ball having a predetermined diameter and so as to form a thermally-influenced portion of the metallic wire adjacent to the metallic ball, wherein the thermally-influenced portion has coarse crystal grains;
bonding the metallic ball having the predetermined diameter to an electrode of a semiconductor element;
moving the capillary toward a side of the metallic ball and downward so as to produce a bump-forming portion of the metallic wire;
bonding the bump-forming portion of the metallic wire to the metallic ball;
pressing the capillary against the metallic wire at a breaking position so as to reduce a cross-sectional area of the metallic wire at the breaking position; and
pulling the metallic wire so as to break the metallic wire at the breaking position such that the bump-forming portion remains bonded to the metallic ball, wherein a size of the predetermined diameter of the metallic ball is controlled such that the thermally-influenced portion is located entirely inside the breaking position.

7. The method of claim 6, wherein the predetermined diameter of the metallic ball is controlled by regulating at least one of a bonding pressure, a pressing speed, a bonding time, and a bonding temperature during said bonding of the metallic ball to the electrode.

8. A bump formed according to the method of claim 7.

9. A bump formed according to the method of claim 6.

10. A method of forming a two-staged projecting bump, comprising:
passing a metallic wire through a capillary;
melting a leading end of the metallic wire so as to form a metallic ball and a thermally-influenced portion of the metallic wire adjacent to the metallic ball, wherein the thermally-influenced portion has coarse crystal grains and wherein a remainder of the metallic wire excluding the thermally-influenced portion has a predetermined hardness;
bonding the metallic ball to an electrode of a semiconductor element;
moving the capillary toward a side of the metallic ball and downward so as to produce a bump-forming portion of the metallic wire;
bonding the bump-forming portion of the metallic wire to the metallic ball;
pressing the capillary against the metallic wire at a pressing position so as to reduce a cross-sectional area of the metallic wire at the pressing position, wherein a hardness of the metallic wire at the pressing position is at least $\frac{2}{3}$ of the predetermined hardness of the remainder of the metallic wire; and
pulling the metallic wire so as to break the metallic wire at a breaking position such that the bump-forming portion remains bonded to the metallic ball.

11. The method of claim 10, wherein said melting of the leading end of the metallic wire is controlled so as to regulate a length of the thermally-influenced portion of the metallic wire.

12. A bump formed according to the method of claim 11.

13. A bump formed according to the method of claim 10.

14. A method of forming a two-staged projecting bump, comprising:
passing a metallic wire through a capillary;
melting a leading end of the metallic wire so as to form a metallic ball and a thermally-influenced portion of the metallic wire adjacent to the metallic ball, wherein the thermally-influenced portion has coarse crystal grains;
bonding the metallic ball to an electrode of a semiconductor element;
moving the capillary toward a side of the metallic ball and downward so as to produce a loop-shaped bump-forming portion of the metallic wire;
bonding the loop-shaped bump-forming portion of the metallic wire to the metallic ball;
pressing the capillary against the metallic wire at a breaking position so as to reduce a cross-sectional area of the metallic wire at the breaking position; and
pulling the metallic wire so as to break the metallic wire at the breaking position such that the loop-shaped bump-forming portion remains bonded to the metallic ball, wherein said moving of the capillary is controlled so as to form a loop-shaped bump-forming portion having a size such that the thermally-influenced portion is located entirely inside the breaking position.

15. The method of claim 14, wherein said moving of the capillary comprises moving the capillary so as to move the metallic wire away from the metallic ball and subsequently moving the metallic wire toward the metallic ball so as to bond the metallic wire to the metallic ball.

16. A bump formed according to the method of claim 15.

17. A bump formed according to the method of claim 14.

18. A method of forming a two-staged projecting bump, comprising:

passing a metallic wire through a capillary;

melting a leading end of the metallic wire so as to form a metallic ball and a thermally-influenced portion of the metallic wire adjacent to the metallic ball, wherein the thermally-influenced portion has coarse crystal grains and wherein a remainder of the metallic wire excluding the thermally-influenced portion has a predetermined hardness;

bonding the metallic ball to an electrode of a semiconductor element;

moving the capillary toward a side of the metallic ball and downward so as to produce a loop-shaped bump-forming portion of the metallic wire;

bonding the loop-shaped bump-forming portion of the metallic wire to the metallic ball;

pressing the capillary against the metallic wire at a pressing position so as to reduce a cross-sectional area of the metallic wire at the pressing position; and pulling the metallic wire so as to break the metallic wire at a breaking position such that the bump-forming portion remains bonded to the metallic ball, wherein said moving of the capillary is controlled so as to form the loop-shaped bump-forming portion having a size such that a hardness of the metallic wire at the pressing position is at least $2/3$ of the predetermined hardness of the remainder of the metallic wire.

19. A bump formed according to the method of claim 18.

\* \* \* \* \*